(12) United States Patent
Chen et al.

(10) Patent No.: US 7,330,358 B2
(45) Date of Patent: Feb. 12, 2008

(54) MOUNTING APPARATUS FOR MOTHERBOARDS

(75) Inventors: Yun-Lung Chen, Tu-Cheng (TW); Yong-Chao Zou, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 393 days.

(21) Appl. No.: 11/019,819

(22) Filed: Dec. 21, 2004

(65) Prior Publication Data

US 2005/0168959 A1    Aug. 4, 2005

(30) Foreign Application Priority Data

Feb. 4, 2004    (TW) .............................. 93205025 U

(51) Int. Cl.
*H05K 7/02* (2006.01)
*H05K 7/04* (2006.01)

(52) U.S. Cl. ...................... 361/810; 361/801; 361/759; 361/752

(58) Field of Classification Search ................ 361/726, 361/732, 740, 747, 759, 801–802, 807, 779, 361/784, 752, 797, 800, 600, 683; 174/138 D, 174/138 G; 312/216, 223
See application file for complete search history.

(56) References Cited

U.S. PATENT DOCUMENTS

| | | | |
|---|---|---|---|
| 6,470,555 B2 | 10/2002 | Boe | |
| 6,934,162 B2* | 8/2005 | Perez et al. | 361/759 |
| 2004/0125575 A1* | 7/2004 | Chen et al. | 361/759 |

* cited by examiner

*Primary Examiner*—Tuan T. Dinh
*Assistant Examiner*—Hung S Bui
(74) *Attorney, Agent, or Firm*—Morris Manning Martin LLP; Tim Tingkang Xia, Esq.

(57) ABSTRACT

A mounting apparatus for mounting a motherboard (10) includes a base (80), an operating member (40) and a supporting tray (20). The base has a plurality of first standoffs (82) formed thereon. The operating member is pivotably attached to the base. The operating member includes a driver (44). The supporting tray is adapted to be attached to the motherboard. The supporting tray defines an opening (291) for receiving the driver therein. The driver is pivoted to engage with the edge of the opening, so that the motherboard moves horizontally to be secured to the first standoffs of the base.

20 Claims, 4 Drawing Sheets

MOUNTING APPARATUS FOR MOTHERBOARDS

BACKGROUND OF THE INVENTION

1. Field of the Invention

The present invention relates to mounting apparatuses, and particularly to a mounting apparatus that readily attaches a motherboard onto a computer chassis.

2. Description of the Related Art

Conventional methods of installing a circuit board, such as a motherboard, to a computer chassis use small hardware devices such as screws or rivets. When using such objects to mount the motherboard to a computer chassis, an appropriate tool must be used, e.g., a screwdriver or riveter. Using tools to connect these components may damage the motherboard, if the tool slips during the assembly process. Additionally, the process of mounting the motherboard to the chassis may require working in tight space or require the use of small hardware and tools, which can make the assembly process difficult. Thus, these motherboard installation methods are unduly laborious and time-consuming.

An improvement in the mounting of a motherboard in a computer chassis is illustrated and described in U.S. Pat. No. 6,470,555. In this patent, a method of removably mounting a motherboard is disclosed. The method comprises positioning a first fastener of a mounting device adjacent a mounting slot in the chassis, inserting the first fastener of the mounting device through the mounting slot in the chassis, releasing the mounting device so that the first fastener clamps onto the chassis through the mounting slot, positioning a second fastener of the mounting device adjacent a mounting hole on the motherboard, and inserting the second fastener of the mounting device in to the mounting hole until the second fastener clasps onto the motherboard through the mounting hole.

However, the motherboard is directly assembled and disassembled onto the chassis when using the above method. The operating space for mounting the motherboard is limited; so that components on the motherboard or on the chassis adjoin the motherboard is prone to be damaged.

Thus an improved mounting apparatus for motherboards that overcomes the above-mentioned problems is desired.

SUMMARY OF THE INVENTION

Accordingly, an object of the present invention is to provide a mounting apparatus which readily and conveniently secures a motherboard to a computer chassis.

To achieve the above-mentioned object, a mounting apparatus for mounting a motherboard comprises a base, an operating member and a supporting tray. The base has a plurality of first standoffs formed thereon. The operating member is pivtably attached to the base. The operating member comprises a driver. The supporting tray is adapted to be attached to the motherboard. The supporting tray defines an opening for receiving the driver therein. The driver is pivoted to engage with the edge of the opening, so that the motherboard moves horizontally to be secured to the first standoffs of the base.

Other objects, advantages and novel features of the present invention will be drawn from the following detailed description of a preferred embodiment of the present invention with attached drawings, in which:

DETAILED DESCRIPTION OF THE INVENTION

Figure 1:
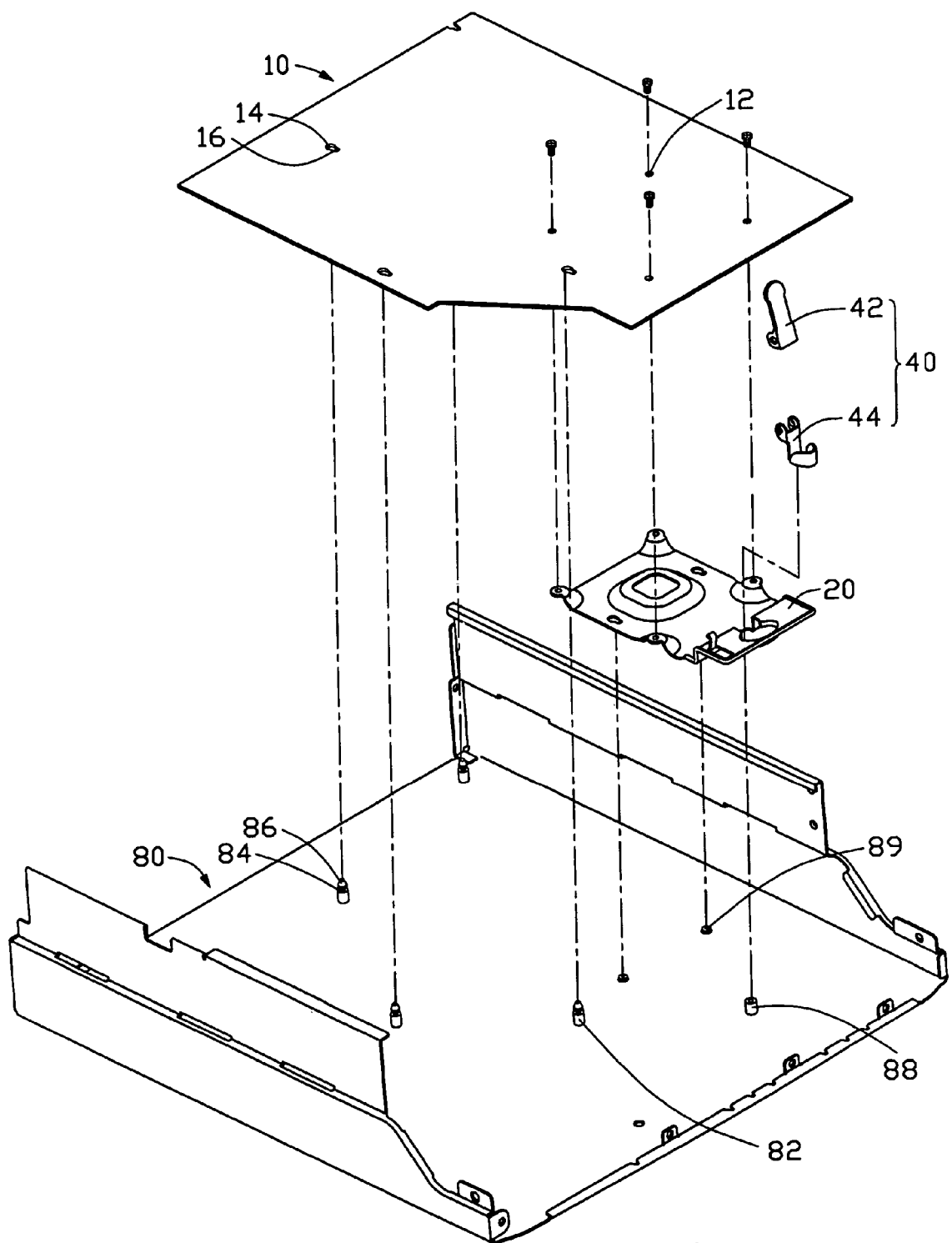
FIG. 1 is an exploded, isometric view of a mounting apparatus in accordance with a preferred embodiment of the present invention together with a motherboard, the mounting apparatus comprising a base, an operating member and a supporting tray.

Referring to FIG. 1, a mounting apparatus in accordance with the preferred embodiment of the present invention is used to assemble and disassemble a motherboard 10 with a chassis of an electronic device like a computer. The mounting apparatus comprises a base 80, a supporting tray 20 and an operating member 40.

The base 80 has a plurality of first standoffs 82 and second standoffs 89 arranged thereon. The second standoff 89 is only shorter than the first standoff 82. Each standoff 82/89 includes a cylindrical body, a top head 86 and a cylindrical narrowed neck 84 between the head 86 and the body. The head 86 is generally spherical. A length of the neck 84 is substantially equal to a thickness of a motherboard 50. Additionally, a pivot 88 is formed adjacent to an end of the chassis 80 thereon.

Referring also to FIG. 1, corresponding to the first standoffs 82 on the chassis 80, the motherboard 10 defines a plurality of first mounting holes therein. Each mounting hole comprises a circular portion 14, and an adjacent slot portion 16 in communication with the circular portion 14. A diameter of the circular portion 14 is slightly larger than a diameter of the largest cross-section of the head 86 of the standoff 82. A width of the slot portion 14 is substantially the same as a diameter of the neck 84 of the standoff 82. Four screw holes 12 are defined on the motherboard 10 for securing the supporting tray 20 thereon.

Figure 2:
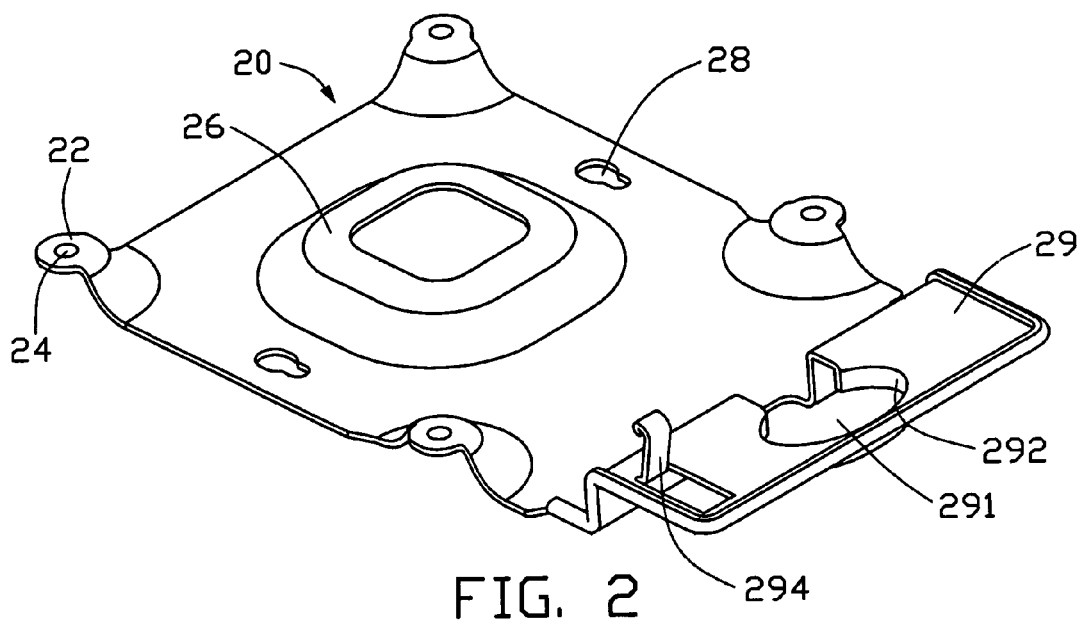
FIG. 2 is an enlarged view of the supporting tray of FIG. 1.

Referring also to FIG. 2, the supporting tray 20 is secured on a bottom surface of the motherboard 10 and is integrally formed from a rectangular planar panel. Two pairs of projections 22 are symmetrically projected from the supporting tray 20. A fixing hole 24 is defined in each projection 22 corresponding to the screw hole 12 of the motherboard 10. At the centre of the supporting tray 20, there is a platform 26 with an opening defined. The platform 26 abuts on the motherboard 10 when the supporting tray 20 is attached thereto. A pair of second mounting holes 28 is defined at two sides of the platform 26. The second mounting holes 28 are the same as the first mounting holes in the motherboard 10, for engaging with the second standoffs 89 while the first mounting holes engage with the first standoffs 82.

An L-shaped rack 29 extends upwardly from an end of the supporting tray 20. A generally elliptic opening 291 is defined in the rack 29, with peripheral wall 292 extending downwardly. A tab 294 is bent upright beside the elliptic opening 291.

Figure 3:
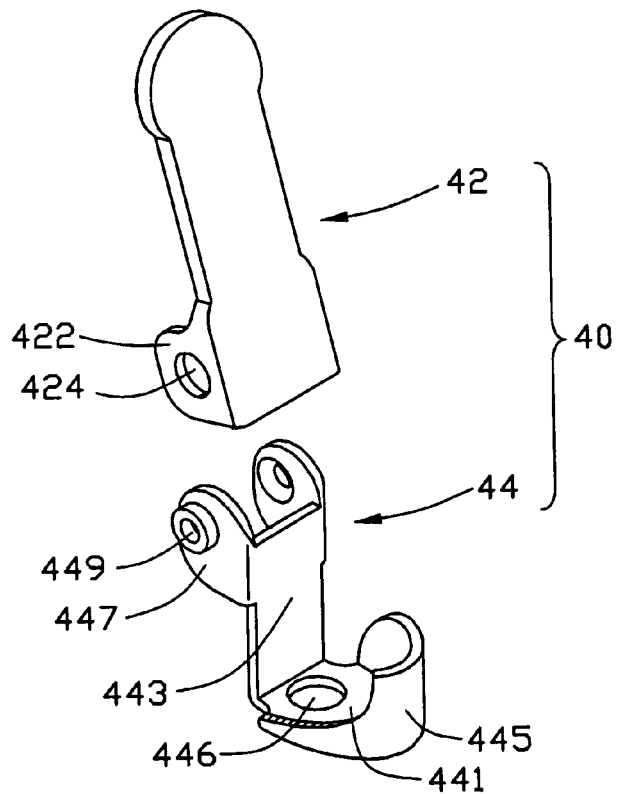
FIG. 3 is an enlarged, cutaway view of the operating member of FIG. 1.

Referring to FIG. 3, the operating member 40 comprises a handle 42 and a driver 44. The driver 44 has a half-elliptic base plate 441 with peripheral wall 445 extending upwardly, for engaging with the peripheral wall 292 of the opening 291. It is preferred that the convex of the peripheral wall 445 corresponds with the concave of the peripheral wall 292. A pivot hole 446 is defined in the centre of the base plate 441, for engaging with the pivot 88 formed on the chassis 80. A post 443 extends upwardly from the base plate 441 with a pair of tabs 447 formed at lateral sides. A pivot 449 is formed on each tab 447. Corresponding to the pivots 449, there is a pair of tabs 422 each with a hole 424 defined at an end of the handle 42, so that the handle 42 is pivtably connected with the driver 44.

Figure 4:
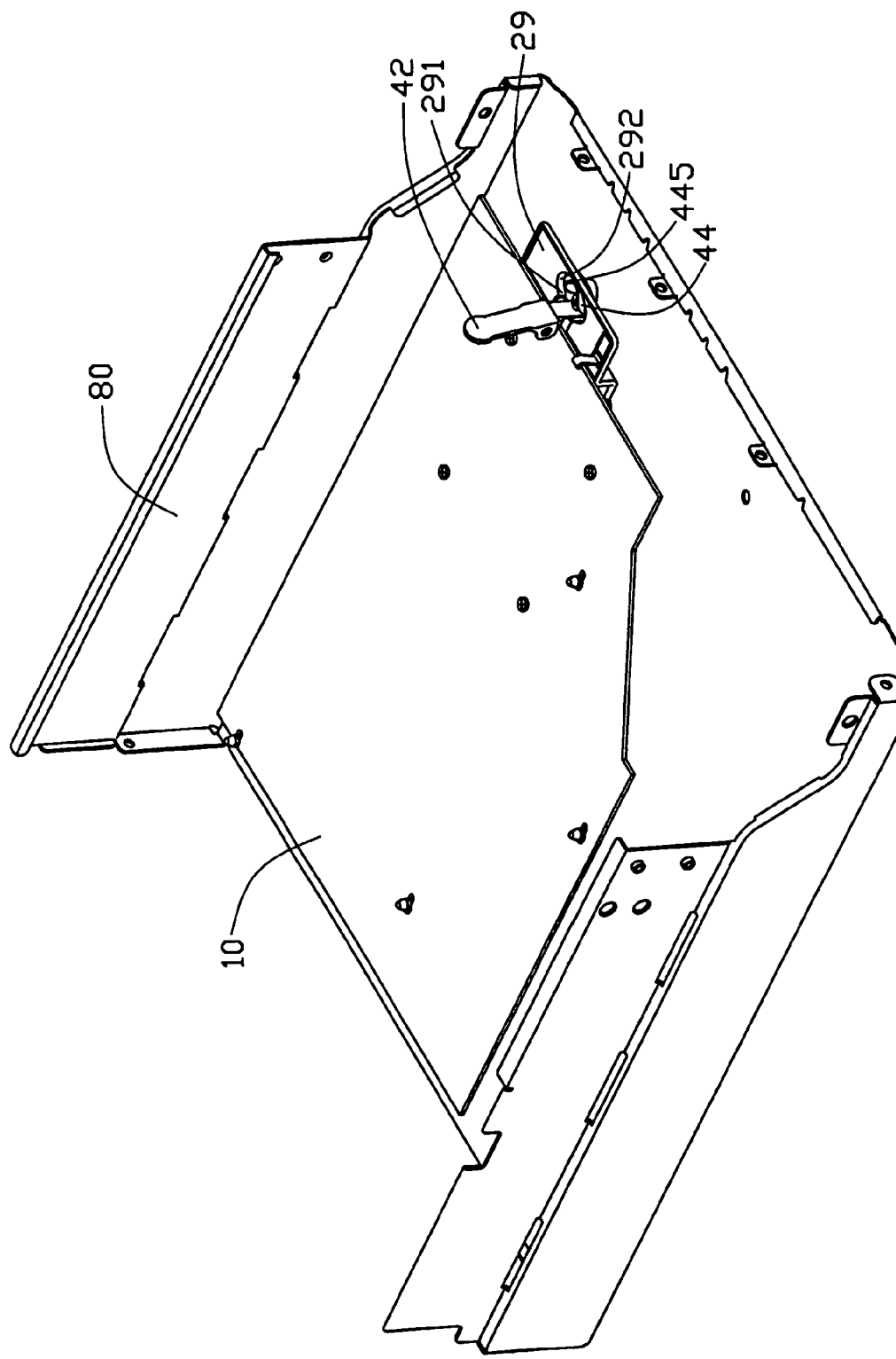
FIG. 4 is an initial assembly state view of the mounting apparatus of FIG. 1.

Referring back to FIG. 1, in assembly, the operating member 40 is secured to the chassis 80 initially, with the pivot hole 446 engaging with the pivot 88. The supporting tray 20 is attached to the bottom surface of the motherboard 10 with screws. Referring also to FIG. 4, the motherboard 10 is placed downwardly to have the heads 86 of the first standoffs 82 extend through the circular portions 14 of the first mounting holes thereof. The necks 84 of the first standoffs 82 are thus received in the circular portions 14. In the same way, the necks of the second standoffs 89 are received in the circular portions of the second mounting holes 28 in the supporting tray 20. The operating member 40 is received in the opening 291 of the supporting tray 20, as shown in FIG. 4.

Figure 5:
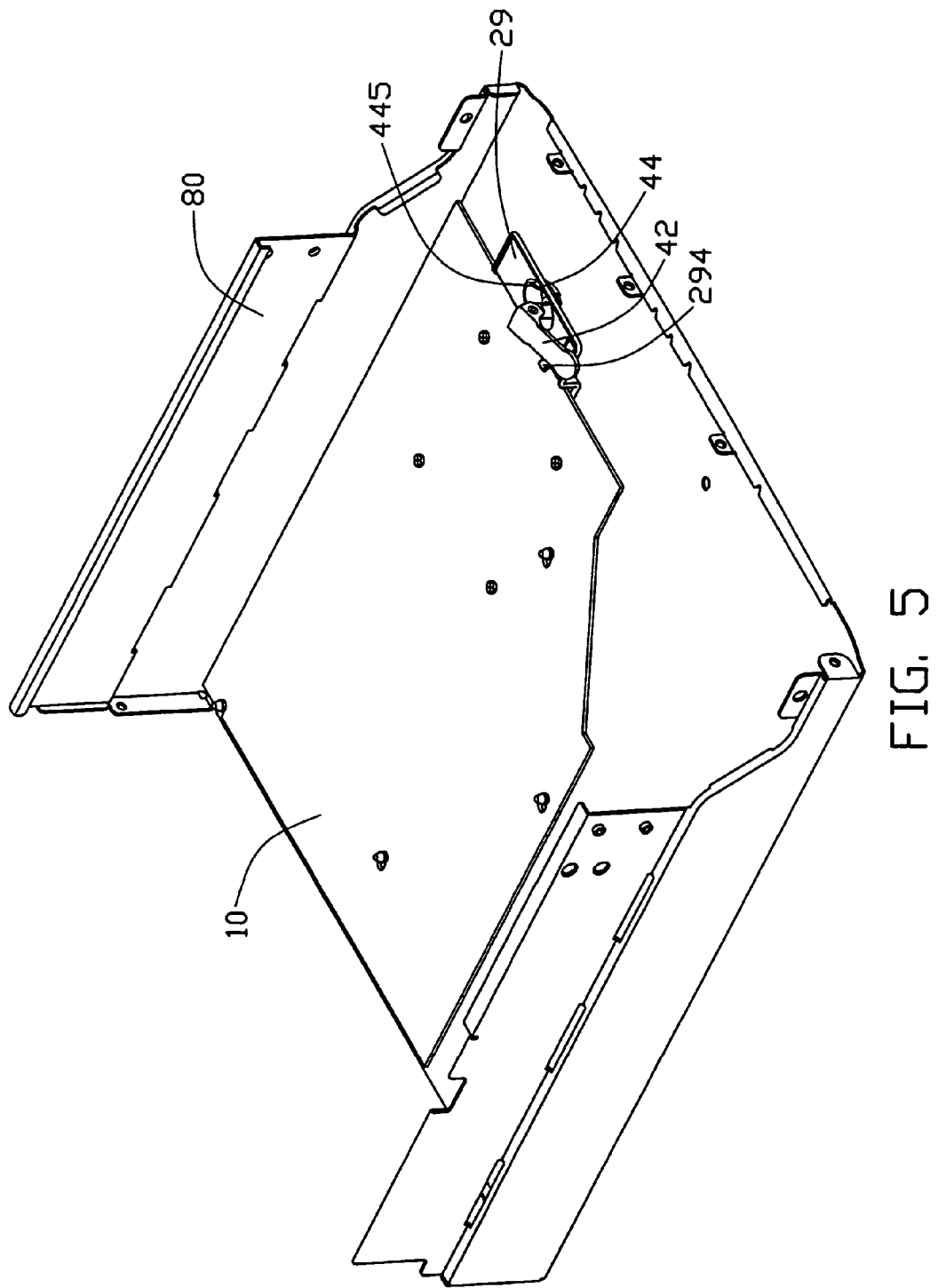
FIG. 5 is a fully assembled view of the mounting apparatus of FIG. 1.

The handle 42 is turned with respect to the pivot 88 on the chassis 80, thereby to cause the driver 44 to pivot. After pivoting about 90 degrees, the peripheral wall 445 of the driver 44 abuts against the opening 291. The supporting tray 29 and the motherboard 10 is driven to move horizontally by the driver 44. The necks 84 of the standoffs 82 are thus received in the slot portions 16 of the motherboard 10. The motherboard 10 is thus sandwiched between the heads 86 and the bodies of the standoffs 82, and is accordingly securely mounted to the computer enclosure. Then, the handle 42 is folded downwardly (referring to FIG. 5). The handle 42 is stopped by the tab 294 from turning back.

In disassembly, the handle 42 is pushed up and turned backward. The motherboard is pulled by the driver 44 to move in reverse. The necks 84 of the standoffs 82 exit the slot portions 16 and enter the circular portions 14 of the motherboard 10. The motherboard 10 is then easily removed from the standoffs 82.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A mounting apparatus for mounting a motherboard, the mounting apparatus comprising:
    a base with a plurality of standoffs formed thereon;
    an operating member pivotably attached to the base, the operating member comprising a driver; and
    a supporting tray being attached to the motherboard, the supporting tray defining an opening to receive the driver therein, wherein the driver is pivoted in the opening to engage with the edge of the opening, so that the motherboard moves horizontally to be secured to the standoffs of the base.

2. The mounting apparatus as described in claim 1, wherein two pairs of projections are symmetrically projected from the supporting tray for attaching to the motherboard.

3. The mounting apparatus as described in claim 2, wherein a platform with an opening defined is formed on the supporting tray.

4. The mounting apparatus as described in claim 1, wherein the supporting tray has an L-shaped rack extending from an end thereof and the opening is defined in the rack.

5. The mounting apparatus as described in claim 4, wherein a tab is formed on the rack for stopping the driver turning.

6. The mounting apparatus as described in claim 1, wherein the opening has peripheral wall formed along the edge thereof.

7. The mounting apparatus as described in claim 1, wherein the driver has a base plate with a peripheral wall formed.

8. The mounting apparatus as described in claim 1, wherein the operating member further comprises a handle pivotably connected with the driver.

9. The mounting apparatus as described in claim 1, wherein the base forms a pivot thereon, and the operating member defines a pivot hole corresponding to the pivot.

10. A circuit board mounting system comprising:
    a circuit board defining a plurality of first mounting holes;
    a base with a plurality of first standoffs formed thereon;
    an operating member pivotably attached to the base, the operating member comprising a cam; and
    a supporting tray being attached to the circuit board, the supporting tray defining an opening to receive the cam therein, wherein the cam is pivoted to engage with the edge of the opening, so that the circuit board moves horizontally and the first mounting holes engage with the first standoffs.

11. The mounting apparatus as described in claim 10, wherein the cam is half-elliptic.

12. The mounting apparatus as described in claim 11, wherein the cam has peripheral wall extending therefrom.

13. The mounting apparatus as described in claim 10, wherein the opening is generally elliptic.

14. The mounting apparatus as described in claim 13, wherein the opening has peripheral wall along the edge thereof.

15. The mounting apparatus as described in claim 10, wherein each first mounting hole includes a circular portion and a slot portion, and each first standoff of the base includes a head and a neck for extending into the corresponding first mounting hole.

16. The mounting apparatus as described in claim 15, wherein a diameter of the circular portion is slightly larger than a diameter of the largest cross-section of the head of the first standoff, and a width of the slot portion is substantially the same as a diameter of the neck of the first standoff.

17. The mounting apparatus as described in claim 16, wherein the supporting tray defines a plurality of second mounting holes, each second mounting hole including a circular portion and a slot portion, and the base correspondingly forms a plurality of second standoffs, each second standoff including a head and a neck for extending into the corresponding second mounting hole.

18. The mounting apparatus as described in claim 17, wherein a diameter of the circular portion is slightly larger than a diameter of the largest cross-section of the head of the second standoff, and a width of the slot portion is substantially the same as a diameter of the neck of the second standoff.

19. A mounting apparatus for mounting a circuit board to a chassis of an electronic device, the mounting apparatus comprising:
- an operating member supportively attached to the chassis and movable relative to the chassis, the operating member comprising a driver engaging with a pivot formed on the chassis; and
- a supporting tray being attachable to the circuit board and movable together therewith, the supporting tray defining an opening in a predetermined plane to receive the driver therein, the driver being engagable with edges of the opening from one side to another adjacent side due to movement of the operating member around the pivot of the chassis so as to control movement of the supporting tray and the circuit board along directions in the predetermined plane.

20. The mounting apparatus as described in claim 19, wherein the supporting tray has an L-shaped rack extending from an end thereof and the opening is defined in the rack.

* * * * *